United States Patent
Vasquez (10) Patent No.: US 7,020,223 B2
(45) Date of Patent: Mar. 28, 2006

(54) VITERBI DECODER AND METHOD USING SEQUENTIAL TWO-WAY ADD-COMPARE-SELECT OPERATIONS

(75) Inventor: Maximino Vasquez, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 755 days.

(21) Appl. No.: 10/123,744

(22) Filed: Apr. 16, 2002

(65) Prior Publication Data

US 2003/0194025 A1    Oct. 16, 2003

(51) Int. Cl.
*H04L 27/06* (2006.01)
*H03M 13/03* (2006.01)

(52) U.S. Cl. ..................... 375/341; 714/795; 714/796
(58) Field of Classification Search ............. 375/316, 375/341, 262, 340, 261, 265, 259; 714/786, 714/792, 794–796
See application file for complete search history.

(56) References Cited

U.S. PATENT DOCUMENTS

| 5,422,894 | A | * | 6/1995 | Abe et al. ............... 714/755 |
| 5,432,803 | A | * | 7/1995 | Liu et al. ................ 714/794 |
| 5,740,203 | A |   | 4/1998 | Ramaswamy et al. .... 375/341 |
| 5,928,378 | A | * | 7/1999 | Choi ........................ 714/795 |
| 5,970,104 | A | * | 10/1999 | Zhong et al. ........... 375/341 |
| 6,023,783 | A | * | 2/2000 | Divsalar et al. ......... 714/792 |
| 6,081,562 | A | * | 6/2000 | He et al. ................. 375/341 |
| 6,301,314 | B1 |  | 10/2001 | Murayama ............... 375/341 |
| 6,301,684 | B1 |  | 10/2001 | Watanabe et al. ....... 714/796 |
| 6,324,226 | B1 |  | 11/2001 | Sasagawa ................ 375/341 |
| 6,708,308 | B1 | * | 3/2004 | De Souza et al. ...... 714/795 |
| 6,901,118 | B1 | * | 5/2005 | Hocevar et al. ......... 375/341 |
| 2002/0021721 | A1 | * | 2/2002 | Jiang et al. ............. 370/910 |

* cited by examiner

*Primary Examiner*—Tesfaldet Bocure
*Assistant Examiner*—Vineeta Panwalkar
(74) *Attorney, Agent, or Firm*—Schwegman, Lundberg, Woessner & Kluth, P.A.

(57) ABSTRACT

In a Viterbi decoder, $2^n$-way add-compare-select (ACS) operations are performed by sequential and/or parallel two-way ACS operations. In one embodiment, first two-way ACS operations generate an interim path metric for each of a plurality of interim states. Second two-way ACS operations generate a path metric for each of a plurality of next states. This process may be repeating for subsequent groups of bits to generate branch transitions through a trellis. A path having a lowest path metric may be selected and a decoded bit sequence determined based on the selected path. In generating the decoded bit sequence, the interim states of the selected path do not have to be used for code rates k/n when k is two or greater. The interim states may be used for code rates k/n when k=1.

27 Claims, 6 Drawing Sheets

VITERBI DECODER AND METHOD USING SEQUENTIAL TWO-WAY ADD-COMPARE-SELECT OPERATIONS

FIELD OF THE INVENTION

The present invention pertains to electronic communications, and in particular, to decoding convolutionally encoded data.

BACKGROUND OF THE INVENTION

Digital communication systems have many ways of transmitting data through noisy communication channels that help facilitate recovery of the data at the receiver. One conventional method involves convolutionally encoding the data prior to transmission. In such a system, convolutional encoding may be performed after the addition of error correction codes and compression of the data. The convolutional encoding process embeds bits in the data stream resulting in a greater number of bits for transmission depending on the rate of the coder.

In a digital wireless system, for example, in-phase (I) signals and qudrature-phase (Q) signals may be generated from the convolutionally encoded data and modulated onto a carrier frequency for transmission to a receiver. In this way, a wireless communication device can transmit digital information, including voice and data, over a noisy channel to another wireless communication device via a base station, for example.

When receiving communications, the receiver performs a frequency conversion on the received signals and generates the I and Q signals by quadrature detection. An estimate of the original convolutionally encoded data may be reproduced from the I and Q signals. Convolutional decoding may then be carried out to recover the original data. Convolutional encoding provides for error correcting because only some of the possible sequences are valid outputs from the encoder. These sequences correspond to possible paths through a trellis. In digital communication systems, convolutional encoding is performed to help assure that data can be recovered even when the communication environment becomes poor. For example, wireless communication devices are often used in environments with poor or noisy transmission characteristics, such as in a car where distortion occurs in the received signals. A convolutional decoder is conventionally used to reduce bit error rates and enhance performance.

One common convolutional decoding process is known as Viterbi decoding. Viterbi decoding detects a most likely transition path among multiple symbols by estimating the probabilities of transitions in convolutionally encoded serial input data. Decoding of the input data is based on the detected most likely transition path. Accurate decoding results can be obtained even in the case where a sudden large change in the signal level of input data occurs.

A Viterbi decoder is used for maximum likelihood decoding of convolutional codes. From a plurality of known code sequences of possible input code sequences, a code sequence is selected as a maximum likelihood code sequence. The selected code sequence may be generated by a convolutional encoder that generates an output sequence closest in code distance to the received data. The maximum likelihood code sequence is referred to as the maximum likelihood path. The decoded data may be obtained from this path. In a Viterbi decoding process, a combination of maximum likelihood branches out of several respective branches reaching the respective encoder states is selected along with a surviving path. This process continues until a predetermined path length is obtained and then a maximum likelihood surviving path is traced back to decode the input signal.

A Viterbi decoder generally includes a branch metric calculation unit and an add-compare-select (ACS) unit. The branch metric calculation unit calculates branch metrics (i.e., distances between the input code sequences and code sequences predicted in respective branches). The ACS unit calculates accumulated path metrics and selects surviving paths. A path metric transition diagram may be prepared based on a trellis diagram.

A convolutional encoder takes k bits at a time and produces groups of n output bits, where n is greater than k. When k is the input data rate and n is the output data rate, the code is known as a k/n code. For example, an encoder that takes one bit at a time and produces two output bits is called a ½ rate coder, while an encoder that takes two bits at a time and produces three bits is a ⅔ rate coder. Different ACS operations are conventionally required for code rates of a different k. For example, when k is one, two-way ACS operations are generally performed because there are two possible paths to each state. When k is two, four-way ACS operations are generally performed because there are four possible paths to each state. In general, a k/n coder has $2^k$ possible paths into each encoder state and $2^k$ way ACS operations are required in the decoder. Convolutional decoders are generally designed to handle a particular code rate by having elements configured for specifically performing two-way ACS operations, four-way ACS operations, eight-way ACS operations, sixteen-way ACS operations, etc. These specific configurations restrict a decoder's ability to decode different code rates. Convolutional decoders that have been designed to handle more than one code rate have conventionally required significantly more hardware and are more complex.

BRIEF DESCRIPTION OF THE DRAWINGS

The appended claims point out different embodiments of the invention with particularity. However, the detailed description presents a more complete understanding of the present invention when considered in connection with the figures, wherein like reference numbers refer to similar items throughout the figures and:

DETAILED DESCRIPTION

The following description and the drawings illustrate specific embodiments of the invention sufficiently to enable those skilled in the art to practice it. Other embodiments may incorporate structural, logical, electrical, process, and other changes. Examples merely typify possible variations. Individual components and functions are optional unless explicitly required, and the sequence of operations may vary. Portions and features of some embodiments may be included in or substituted for those of others. The scope of the invention encompasses the full ambit of the claims and all available equivalents.

Figure 1:
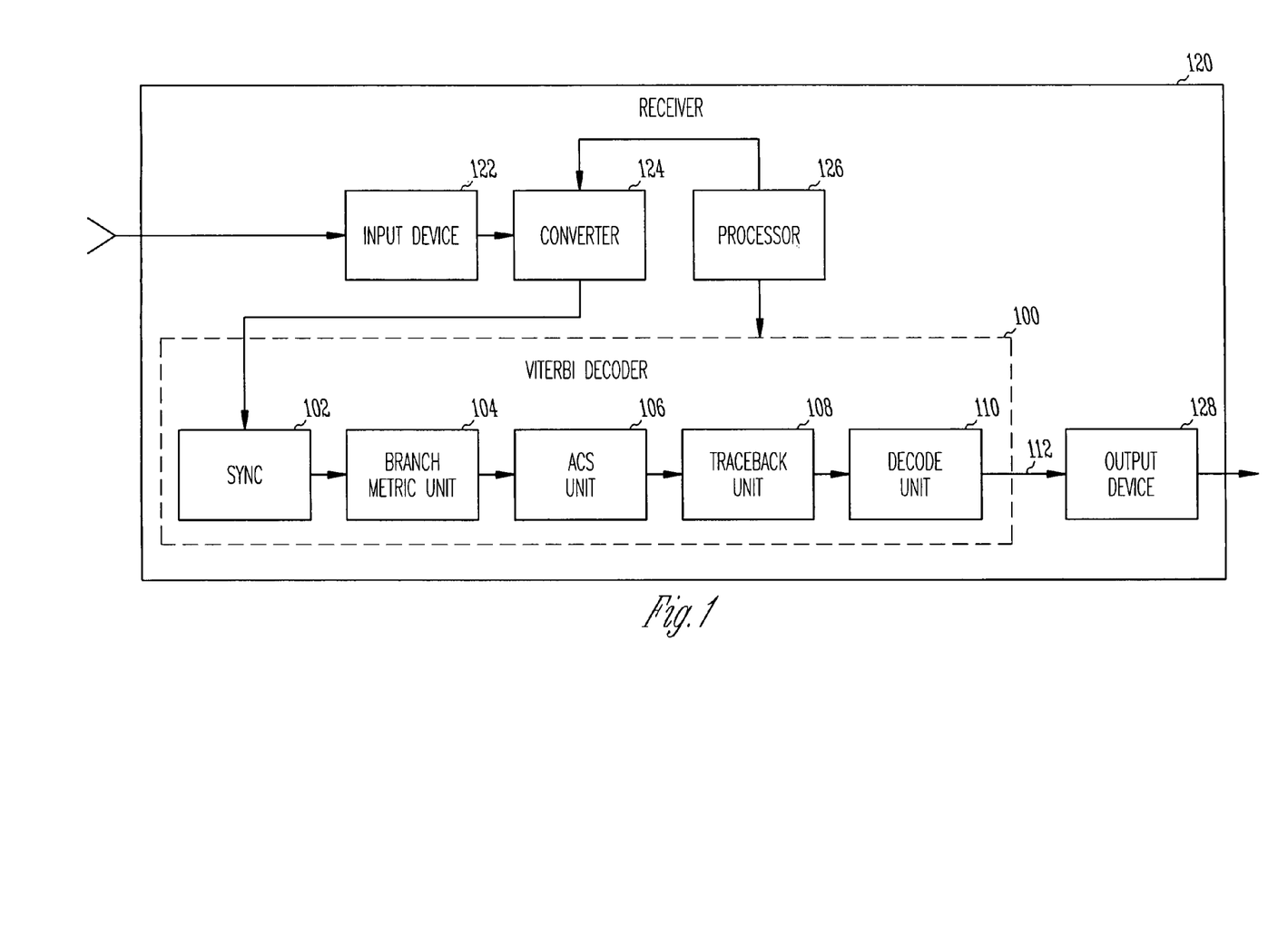
FIG. 1 is a functional block diagram of a receiver in accordance with an embodiment of the present invention.

FIG. 1 is a functional block diagram of a receiver in accordance with an embodiment of the present invention. Receiver 120 is configured to receive convolutionally encoded data which may be decoded by Viterbi decoder 100 and may be especially suitable for receiving data over noisy communication channels. Although the present invention is applicable to almost any communication device, the advantages of the present invention are particularly applicable to wireless, handheld and portable communication devices. By way of example, wireless, handheld and portable communication devices may include wireless and cellular telephones, smart phones, personal digital assistants (PDAs), web-tablets and any device that may provide wireless access to a network such as an intranet or the internet.

An input signal having convolutionally encoded data is received by input device 122 which may, for example, be an antenna, a cable, an optical detector, or the like. Converter 124 may process the received signal to generate in-phase (I) and quadrature-phase (Q) signals which may be down-converted from a modulated carrier frequency to baseband frequency and converted to serial bit streams with an analog to digital converter. The I and Q serial bit streams are provided to Viterbi decoder 100. Using the encoded data streams, the decoder 100 calculates branch metrics and path metrics for the data and determines the path of the data that has the greatest likelihood of occurrence. Decoder 100 generates an output decoded data signal indicative of the data that is most likely to have been transmitted, even when the data is received over a very noisy communication channel. Although this embodiment of the present invention is described as using I and Q signal inputs, other embodiments of the present invention are not limited to the use of I and Q modulated signals. For example, the present invention is equally suitable for use with any modulation scheme, and is also suitable for use with baseband signals having no modulation.

In one embodiment, the received bit streams may have been soft decoded where, for example, instead of a hard "1" or "0" being used for each bit, multiple bits may be used to indicate a value somewhere between a "1" and a "0". For example, if two bits are used for each value, "00" may mean the received value most closely matches a "0" bit, "01" may mean the received value is about 33% of the way between a "0" bit and a "1" bit, "10" may mean the received value is about 66% of the way between a "0" bit and a "1" bit, and "11" may mean the received value most closely matches a "1" bit.

Decoder 100 includes synchronization unit 102, branch metric unit 104, add-compare-select unit (ACS) 106, trace-back unit 108 and decode unit 110. In one embodiment, synchronization unit 102 selects groups of encoded data bits based on feedback signal 112 and provides the selected groups of encoded data bits to branch metric unit 104. The number of bits in a group depends on the rate of the encoder. For example, for a ½ rate encoder, two bits may comprise a group, and for a ⅓ or ⅔ rate encoder, three bits may comprise a group. In general, for a k/n rate decoder, there are n bits per group, and n possible different synchronization points. For a soft decoder, there may be multiple bits per encoded bit, however a soft decoder also may have n synchronization points. Branch metric unit 104 generates branch metrics for branch transitions between a current state and a possible next state of the encoder. ACS unit 106 adds branch metrics to corresponding prior path metrics to determine a new path metric for each possible state of the encoder and generates a branch decision which may be stored in a trace-back memory associated with unit 108. This process may be repeated for a number of input groups until a decoding length is reached. The decoding length may be five to ten times the constraint length. Trace-back unit 108 traces back a surviving path through the trace-back memory based on the branch decisions after the decoding length number of transitions through a trellis as illustrated below. Decode unit 110 may then determine a decoded bit sequence based on the surviving path through the trellis.

The decoded bit sequence provided by decoder 100 may be received by output device 128 and used to generate the output of receiver 120. Output device 128, for example, may generate signals for conversion to audio for voice communications, generate data for a video display or generate data for storage in a memory. In one embodiment, processor 126 may be configured to coordinate the operation of the various functional elements of receiver 120 along with the various functional elements of decoder 100. Although processor 126 is illustrated as a separate functional element, processor 126 may be combined with one or more functional elements of FIG. 1 and may be configured with software and may be implemented with digital signal processors. Hardware elements including integrated circuits may also perform the functionality of the elements illustrated in FIG. 1.

In one embodiment, the present invention provides a method and apparatus for performing four-way, eight-way, or sixteen-way ACS operations with sequential two-way ACS operations. In another embodiment, a Viterbi decoder and improved method for decoding convolutional encoded data is provided. In another embodiment, an integrated circuit for decoding convolutional encoded data is provided. In yet another embodiment, a wireless communication device for decoding convolutional encoded data is provided. First two-way ACS operations may generate an interim path metric for each of a plurality of interim states. Second two-way ACS operations may generate a path metric for each of a plurality of next states. This process may be repeating for subsequent groups of bits to generate branch transitions through a trellis. A path having a lowest path metric may be selected and a decoded bit sequence may be determined from the selected path. In generating the decoded bit sequence, the interim states of the selected path do not have to be used for code rates of k/n when k is two or greater. The interim states may be used for code rates of k/n when k is one.

Figure 2:
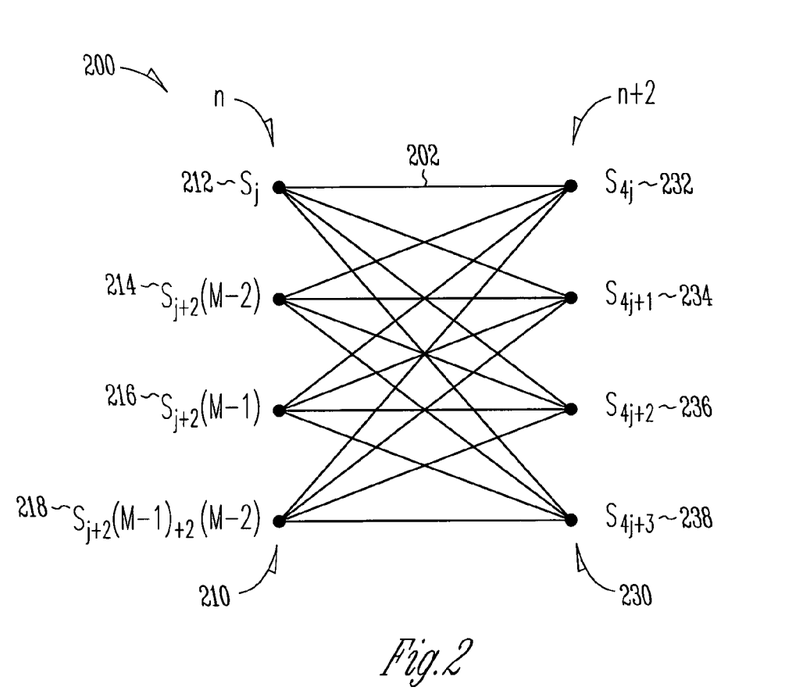
FIG. 2 is an illustration of a four-way trellis butterfly diagram which illustrates the performance of four-way add-compare-select (ACS) operations.

FIG. 2 is an illustration of a four-way trellis butterfly diagram which illustrates the performance of four-way ACS operations in accordance with an embodiment of the present invention. Trellis butterfly diagram 200 is a small portion of an entire trellis diagram which may be used in decoding an incoming bit stream. Butterfly trellis diagram 200 is an abstract depiction of the possible state transitions of encoder states over a sequence of data times. Each data time may be referred to as a stage of the trellis. For simplicity, only states at two data times 210 (n) and 230 (n+2) are illustrated. State transitions at any other time may have the same form. At each data time, decoder 100 receives data that may be in one of a plurality of states. Trellis butterfly diagram 200 illustrates a four-way butterfly diagram in which four possible states 212 through 218 may occur at first time 210. At second time 230, there are four possible states, 232 through 238. The branch transitions from the states 212 through 218 to states 232 through 238 are indicated by the lines connecting the states. Diagram 200 only illustrates four input states (i.e., states 212 through 218) and four output states (i.e., states 232 through 238), however this may be only a subset of the actual number of states possible. Because there may be more than four states, the output states illustrated may differ from the input states illustrated. In the trellis diagram, when M bits are used to define a state, and there may be $2^M$ states. The value of M may range from two to eight or even greater.

In accordance with one embodiment of the present invention, when the encoded data is a serial data stream, it may take two time intervals to transition from one of the states at time 210 to one of the states at time 230. However this depends how the time intervals are defined, but this is not an inherent property of the four-way ACS. The time between times 210 and 230 is the time between one input group of data and the next group of input data. For a 2/n rate input, this will correspond to n bits. However, for a soft decoder, each received bit is represented by multiple bits. A branch metric is generated for each possible initial state at time 210, indicative of the branch transition from an initial state at time 210 to a next state at time 230. For each possible state, a path metric is calculated which is the sum of the path metric of the previous state and the branch metric from such state to the current state. Each branch thus has a candidate path metric from each possible previous state at time 210 to the next state at time 230. The branch that provides the smallest path metric to the next state 230 may be selected as the new path metric for that state. This branch, with the transition to the next state, becomes the path through the trellis to the next state. Although only the states at data times 210 and 230 are shown, this process is repeated for later data times for subsequent data. As the states are selected for each state at the data time under evaluation, path metrics and paths through the trellis are accumulated.

Conventionally, a four-way ACS operation is performed to calculate the path metric for a particular state when there are four branch transitions to each next state. The four-way ACS operation adds the branch metric to the path metric for each previous state, compares the candidate path metric for the current state, and may select the branch transition that may generate, for example, the smallest path metric. Each four-way ACS operation provides a path metric at the time 230 and the branch decision which may be stored in a trace-back memory, for example. A conventional four-way ACS includes a plurality of adders, a compare circuit and a select circuit. For each branch, the adders sum the branch metric and prior path metric to generate candidate path metrics. The compare circuit compares the candidate path metrics and generates the branch decision. The select circuit may select the branch transition having the smallest path metric, for example. The new accumulated path metric is used for the next four-way ACS operations at the next data time.

In diagram 200, Sj represents the state j where M is number of bits defining a state. The four illustrated states per data time may correspond with the possible states corresponding with the two most significant bits of a state. Although only four states at a particular data time are illustrated for simplicity, more than four states at a particular data time are also possible. When M bits are used to define a state, there may be $2^M$ states. Each new state may be generated, for example, in a shift register by shifting in two new bits, for example, into the least significant bits of the old state and shifting out the two most significant bits (e.g., left shifting). In this example encoder, the four input states in diagram 200 represent four states that differ only in the two most significant bits (MSBs). The two MSBs of Sj are "00"; the two MSBs of $Sj+2^{M-2}$ are "01"; the two MSBs of $Sj+2^{M-1}$ are "10"; and the two MSBs of $Sj+2^{M-1}+2^{M-2}$ are "11". Similarly, the four output states may differ only in the two least significant bits (LSBs). For example, the two LSBs of $S_{4j}$ are "00"; the two LSBs of $S_{4j+1}$ are "01"; the two LSBs of $S_{4j+2}$ are "10"; and the two LSBs of $S_{4j+3}$ are "11".

Figure 3:
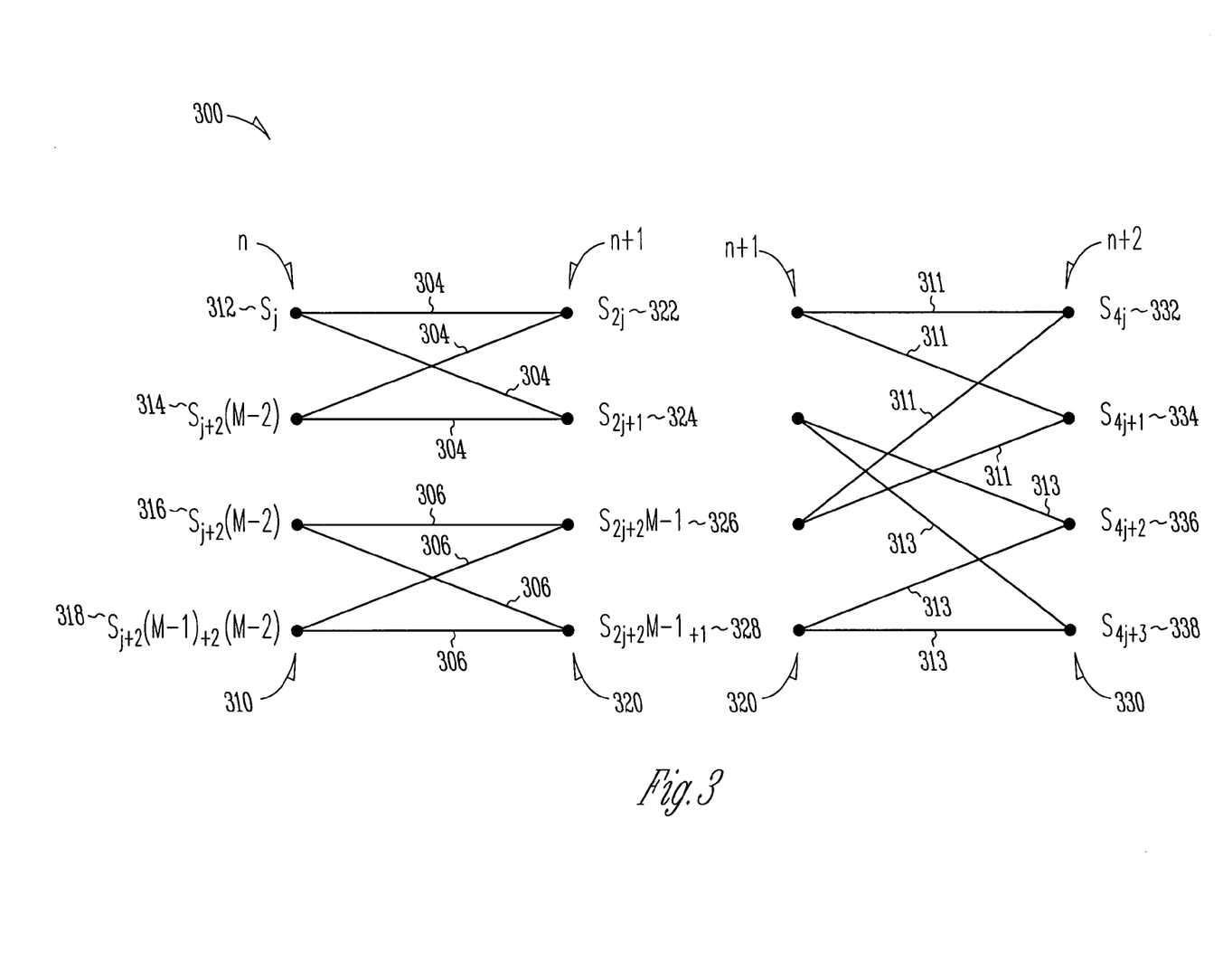
FIG. 3 is an illustration of two-way trellis butterfly diagrams in accordance with an embodiment of the present invention.

FIG. 3 is an illustration of two-way trellis butterfly diagrams in accordance with an embodiment of the present invention. Rather than performing four-way ACS operations as described above, parallel and/or sequential two-way ACS operations are performed in accordance with this embodiment of the present invention. This may allow a Viterbi decoder to handle more than one code rate, reduces the amount of hardware and may reduce the hardware complexity, for example. Trellis butterfly diagrams 300 are functionally equivalent to diagram 200 (FIG. 2) and the operations may be performed with parallel and/or sequential two-way ACS operations rather than with four-way ACS operations.

Four possible states 312, 314, 316 and 318 may occur at first data time 310, four possible interim states 322, 324, 326 and 328 may occur at interim data time 320 and four possible states 332, 334, 336 and 338 may occur at next data time 330. Similar to diagram 200 (FIG. 2), only four of many possible states are illustrated at each data time for ease of understanding. In one embodiment, a two-way ACS operation is performed for each state at data time 320 to generate interim path metrics and a branch decision for each state 322, 324, 326 and 328. Then, a two-way ACS operation may be performed for each state at data time 330 to generate final path metrics and a branch decision for each state 332, 334, 336 and 338. The two-way ACS operations may be performed sequentially and/or in parallel. The two-way ACS operations for states 322, 324, 326 and 328 may be performed prior to the two-way operations for states 332, 334, 336 and 338. The two-way ACS operations may be performed for each state "S" as illustrated by the branch transitions in FIG. 3. States 312, 314, 316 and 318 (FIG. 3) correspond respectively with states 212, 214, 216, and 218 (FIG. 2), and states 332, 334, 336 and 338 (FIG. 3) correspond respectively with states 232, 234, 236 and 238 (FIG. 2).

In one embodiment of the present invention, a single two-way ACS element may be used to sequentially generate the path metrics and branch decisions for each of interim states 322, 324, 326 and 328, and then to sequentially generate the path metrics and branch decisions for each of final states 332, 334, 336 and 338. In another embodiment, four two-way ACS elements may in parallel generate path metrics and branch decisions for each of interim states 322, 324, 326 and 328, and then may in parallel generate path metrics and branch decisions for each of final states 332, 334, 336 and 338. In yet another embodiment, eight two-way ACS elements may be used. In this embodiment, four of the two-way ACS elements may in parallel generate the path metrics and branch decisions for each of interim states 322, 324, 326 and 328, and then another four of the two-way ACS elements may in parallel generate the path metrics and branch decisions for each of final states 332, 334, 336 and 338. This is unlike conventional Viterbi decoding techniques which utilize single four-way ACS operations. The present invention also includes other combinations of two-way ACS elements for generating interim states 322, 324, 326 and 328 at data time 320 and next states 332, 334, 336 and 338 at data time 330 in accordance with diagram 300.

Diagram 300 only illustrates a small portion of a complete trellis having many stages. The ACS operations described above are repeated for a particular decoding length generating several paths through the trellis. The trellis length may be equal to the decoding length which for example, may be five to ten times the constraint length.

Figure 4:
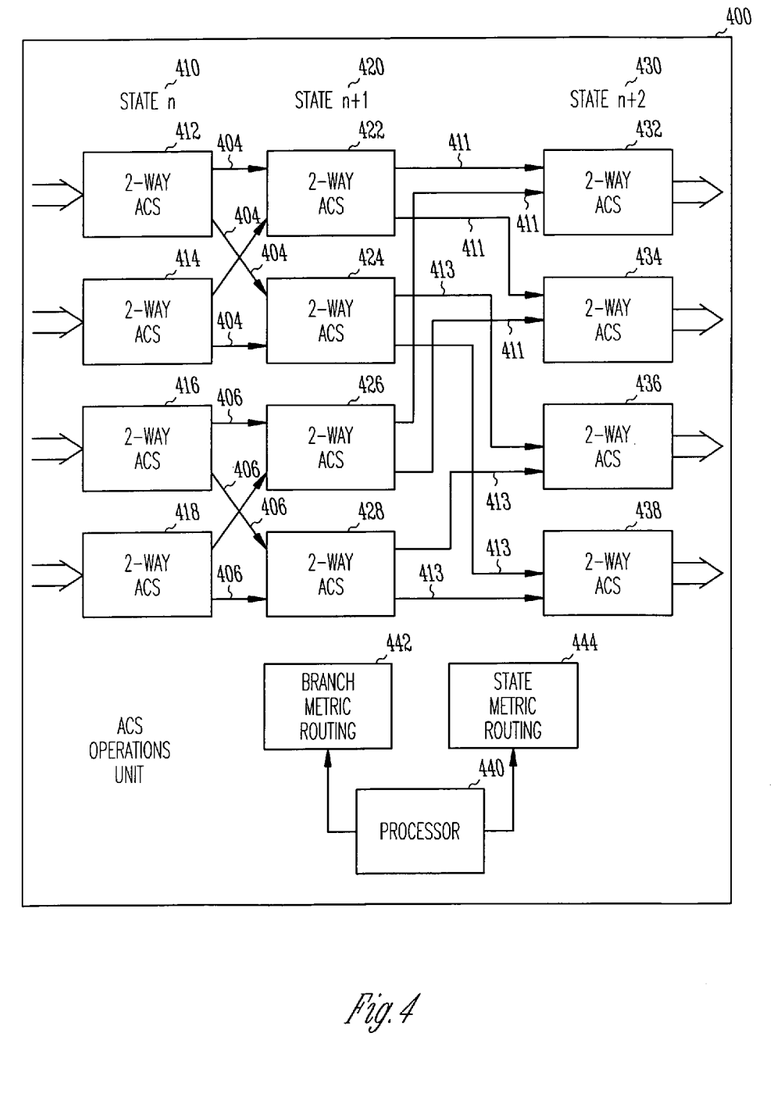
FIG. 4 is a functional block diagram of an add-compare-select operations unit in accordance with an embodiment of the present invention.

FIG. 4 is a functional block diagram of an add-compare-select (ACS) operations unit in accordance with an embodiment of the present invention. ACS operations unit 400 may be comprised of a first functional group of two-way ACS elements 412, 414, 416 and 418, a second functional group of two-way ACS elements 422, 424, 426 and 428, and a third functional group of two-way ACS elements 432, 434, 436 and 438, functionally configured as illustrated. The first group of two-way ACS elements generate path metrics and branch decisions for corresponding states at data time 410, the second group of two-way ACS elements generate interim path metrics and branch decisions for corresponding states at data time 420 and the third group of two-way ACS elements generate next path metrics and branch decisions for corresponding states at data time 430. Branches 404, 406, 411 and 413 functionally couple the two-way ACS elements of the different groups corresponding with the various branches 304, 306, 311 and 313 (FIG. 3) respectively and represent branch transitions between states.

In one embodiment of the present invention, only two actual groups of two-way ACS units may be used. For example, the ACS operations performed by function units 432, 434, 436 and 438 may actually be performed by ACS units 412, 414, 416, and 418 respectively. In other words, states at time 430 correspond to the states at time 410, and branch and path metrics from the states at time 420 fed back to ACS units 412, 414, 416 and 418.

Data time 410 may correspond with data time 310 (FIG. 3), data time 420 may correspond with data time 320 (FIG. 3) and data time 430 may correspond with data time 330 (FIG. 3). For example, two-way ACS element 412 may generate the path metric and branch decision for corresponding state 312 (FIG. 3), two-way ACS element 414 may generate the path metric and branch decision for corresponding state 314 (FIG. 3), two-way ACS element 416 may generate the path metric and branch decision for corresponding state 316 (FIG. 3), and two-way ACS element 418 may generate the path metric and branch decision for corresponding state 318 (FIG. 3). For example, two-way ACS element 422 may generate the path metric and branch decision for corresponding state 322 (FIG. 3), two-way ACS element 424 may generate the path metric and branch decision for corresponding state 324 (FIG. 3), two-way ACS element 426 may generate the path metric and branch decision for corresponding state 326 (FIG. 3), and two-way ACS element 428 may generate the path metric and branch decision for corresponding state 328 (FIG. 3). For example, two-way ACS element 432 may generate the path metric and branch decision for corresponding state 332 (FIG. 3), two-way ACS element 434 may generate the path metric and branch decision for corresponding state 334 (FIG. 3), two-way ACS element 436 may generate the path metric and branch decision for corresponding state 336 (FIG. 3), and two-way ACS element 438 may generate the path metric and branch decision for corresponding state 338 (FIG. 3).

In one embodiment of the present invention, ACS operations unit 400 may include a total of four two-way ACS elements, such as two-way ACS elements 412, 414, 416 and 418. In this embodiment, two-way ACS elements 412, 414, 416 and 418 may, for example, recursively perform the ACS operations of corresponding two-way ACS elements 422, 424, 426 and 428 and corresponding two-way ACS elements 432, 434, 436 and 438. In another embodiment, ACS operations unit 400 may include a total of eight two-way ACS elements, such as two-way ACS elements 412, 414, 416 and 418, and two-way ACS elements 422, 424,426 and 428. In this embodiment, the ACS operations of two-way ACS elements 432, 434, 436 and 438 may be performed by two-way ACS elements 412, 414, 416 and 418. In yet another embodiment, ACS operations unit 400 may include one or more two-way ACS elements to sequentially and/or in parallel perform the ACS operations illustrated.

ACS operations unit 400 may be fabricated on a semiconductor die or integrated circuit. In another embodiment, the operations of ACS operations unit 400 may be performed by a digital signal processor, or other processing element configured with software. In one embodiment, a processor, such as processor 440, may functionally configure the ACS elements for operating in the various ways as described herein. This flexibility applies when the ACS elements are implemented with hardware elements as well as software elements. Accordingly, a Viterbi decoder using ACS operations unit 400 may operate on many different algorithms and/or code rates.

In one embodiment, ACS operations unit 400 includes branch metric routing unit 442 to route branch metrics from a branch metric memory to appropriate two-way ACS elements in accordance with instructions from processor 440. In this embodiment, ACS operations unit 400 may also include path metric routing unit 444 which may route path metrics from a path metric memory to appropriate two-way ACS elements in accordance with instructions from processor 440. Branches 404, 406, 411 and 413, which functionally couple the two-way ACS elements of the different groups, may, for example, be implemented by branch metric routing unit 442, path metric routing unit 444, processor 440 and memory. In one embodiment, processor 440 and routing units 442 and 444 may be external to ACS operations unit 400.

ACS operations unit 400 has been described above as performing the equivalent of four-way ACS operations using two-way ACS elements. These embodiments may be suitable for k/n rate convolutional codes where k is at least 2 and n is greater than k. In these embodiments, the interim states do not have to be used in determining the decoded bit sequence. However, in alternative embodiments of the present invention, ACS operations unit may be configured to decode k/n rate convolutional codes where k=1. In these alternative embodiments, the interim states at data time 420 may be used in determining the decoded bit sequence. Accordingly, ACS operations unit 400 may be suitable for various rate codes. In other embodiments, ACS operations unit 400 may perform the operations of eight-way, sixteen-way, and greater-way ACS operations using two-way ACS elements.

Figure 5:
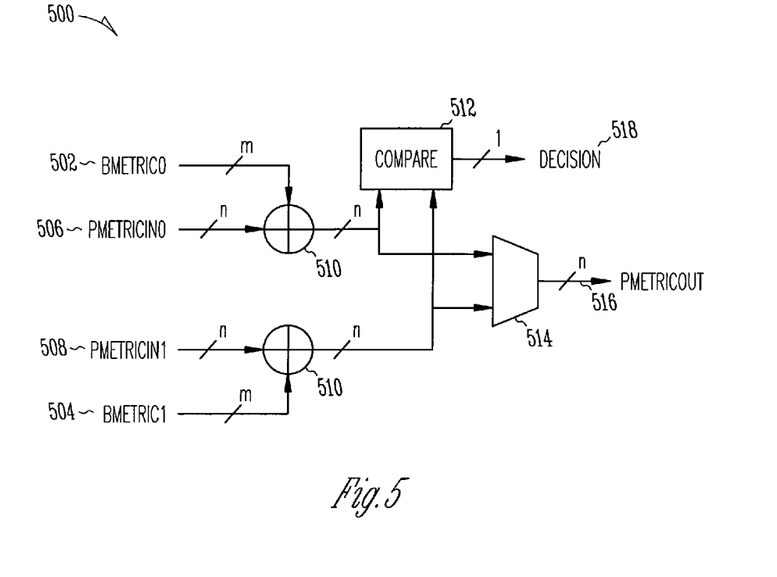
FIG. 5 is a functional block diagram of a two-way add-compare-select element suitable for use with an embodiment of the present invention.

FIG. 5 is a functional block diagram of a two-way ACS element suitable for use with an embodiment of the present invention. Two-way ACS element 500 may perform the function of one of two-way ACS elements illustrated in FIG. 4, such as two-way ACS elements 412, 414, 416, 418, 422, 424, 426, 428, 432,434, 436, 438. ACS element 500 includes adders 510 to add one of branch metrics 502, 504 with one of path metrics 506, 508 from a corresponding prior state to generate two candidate path metrics. The two candidate path metrics are compared in compare element 512 and one of the path metrics is selected by select element 514 and provided at output 516. A branch decision is also provided at branch decision output 518. Branch metrics 502, 504 and path metrics 506, 508 may be retrieved from a memory for corresponding branches and states, and the selected path metric may be stored in a memory for that particular state.

Figure 6:
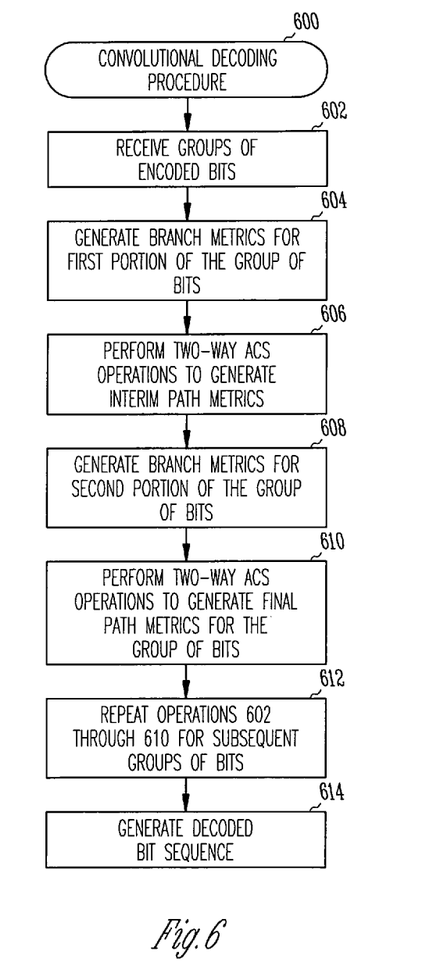
FIG. 6 is a flow chart of a convolutional decoding procedure in accordance with an embodiment of the present invention.

FIG. 6 is a flow chart of a convolutional decoding procedure in accordance with an embodiment of the present invention. Portions of procedure 600 may be performed by elements of receiver 120 (FIG. 1) and elements of decoder 100 (FIG. 1) in conjunction with processing unit 126 (FIG. 1), although other functional element combinations may also be suitable for performing procedure 600. Procedure 600 generates a decoded bit sequence which may have been encoded with a k/n convolutional encoder where k and n may be any whole number and where k may be less than n. Both k and n may be less than twenty, however this is not a requirement, and accordingly, k and n may be much greater than twenty. Procedure 600 may implement sequential and/or parallel two-way ACS operations, even for k/n code rates where k is two or greater. Although the individual operations of procedure 600 are illustrated and described as separate operations, it should be noted that one or more of the individual operations may be performed concurrently. Further, nothing necessarily requires that the operations be performed in the order illustrated.

Operation 602 receives a n-bit group of convolutionally encoded bits of a received sequence of bits. For a soft decoder, there may be multiple bits per encoded bit, however a soft decoder also may have n synchronization points. The group of bits may be provided, for example, by synchronization unit 102 (FIG. 1). Operation 604 generates branch metrics for a first portion of bits of the n-bit group of bits. The branch metrics may be generated for paths between a plurality of current states and corresponding interim states of a plurality of interim states. The number of states in the plurality of interim states may correspond with a number of possible states in the plurality of current states. Referring to diagram 300 (FIG. 3), operation 604 may compute branch metrics for branches 304 and 306. Operation 604 may be performed, for example, by branch metric unit 104 (FIG. 1).

Operation 606 performs a first two-way ACS operation for each of the interim states to generate an interim path metric and an interim branch decision for each of the interim states. Referring to diagram 300 (FIG. 3), operation 606 may generate the path metrics for interim states 322, 324, 326 and 328 using the branch metrics generated in operation 604 and prior corresponding path metrics. Operation 606 may be performed, for example, by ACS unit 106 (FIG. 1).

Operation 608 generates branch metrics for a second portion of bits of the n-bit group of bits in the received sequence of bits. The second portion of bits may consist of the remaining bits of the group. Referring to diagram 300 (FIG. 3), operation 608 may generate branch metrics for branches 311 and 313. The number of states of the plurality of next states may correspond with the number of states in the plurality of current states. Operation 608 may be performed, for example, by branch metric unit 104 (FIG. 1).

Operation 610 performs a second two-way ACS operation for each of the final states to generate a path metric and branch decision for each of the next states. Referring to diagram 300 (FIG. 3), operation 610 may perform a two-way ACS operation for states 332, 334, 336 and 338. Operation 610 may be performed, for example, by ACS unit 106 (FIG. 1). FIG. 3, however, only illustrates a portion of states. When M bits are used to define a state, there may be $2^M$ states. Accordingly, operations 606 and 614 generate a path metric and branch decision for each of states. Each of these branch decisions may be stored in a trace-back memory.

Operation 612 repeats operation 602 through operation 610. Operation 612 may repeat operations 602 through 610 for a particular decoding length generating several paths through a trellis. The trellis length may be equal to the decoding length which for example, may be five to ten times the constraint length. Operation 614 generates a decoded bit sequence from a most likely path through the trellis. Operation 614 may be performed by trace-back unit 108 (FIG. 1) which may trace back a selected path through the trellis using the stored branch decisions from the trace-back memory. Decode unit 110 (FIG. 1) may determine the decoded data based on the transitions of the trace back path.

In one embodiment, procedure 600 may treat the code as a punctured code of rate k/2n. In this embodiment, the branch metrics calculated in operation 604 do not necessarily use any bits of the n-bit group and the branch metrics may all equal zero. Operation 608 may use all n-bits of the n-bit group to generate branch metrics. Alternatively, operation 604 may use all n bits, and operation 608 may use none of the n bits of the group.

The foregoing description of specific embodiments reveals the general nature of the invention sufficiently that others can, by applying current knowledge, readily modify and/or adapt it for various applications without departing from the generic concept. Therefore such adaptations and modifications are within the meaning and range of equivalents of the disclosed embodiments. The phraseology or terminology employed herein is for the purpose of description and not of limitation. Accordingly, the invention embraces all such alternatives, modifications, equivalents and variations as fall within the spirit and broad scope of the appended claims.

What is claimed is:

1. A Viterbi decoder comprising:
   a two-way add-compare-select (ACS) operations unit to perform first two-way ACS operations to generate an interim path metric for each of a plurality of interim states, and to perform second two-way ACS operations for each of a plurality of next states to generate a next path metric for each of the next states, wherein the first and second two-way ACS operations comprise a four-way ACS operation; and
   a branch metric calculation unit to generate branch metrics between the interim states and the next states,
   wherein the interim path metrics are used for code rates of k/n where k is one, and
   wherein the interim path metrics are not used for code rates of k/n where k is greater than one.

2. The decoder of claim 1 wherein the branch metric calculation unit generates branch metrics for branch transitions between initial states and the interim states for a first portion of bits of a group of bits in a received sequence of bits,
   wherein the interim states represent states of the Viterbi decoder between stages of a trellis.

3. The decoder of claim 2 wherein the branch metric calculation unit generates branch metrics for branch transitions between the interim states and the next states for a second portion of bits of the group of bits,
   wherein the branch metric calculation unit refrains from using bits of the first portion of bits for generating the branch metrics between the initial states and the interim states for code rates of k/n when k is greater than one, and wherein the branch metric calculation unit uses bits of the first portion of bits for generating the branch metrics between the initial states and the interim states for code rates of k/n when k is one.

4. The decoder of claim 3 further comprising a synchronization unit to provide the groups of bits of the received sequence of bits to the branch metric calculation unit.

5. The decoder of claim 4 wherein the synchronization unit provides at least two bits to the branch metric calculation unit for the code rates of k/n when k is greater than one, and provides one bit for the code rates of k/n when k is one.

6. The decoder of claim 4 further comprising a decode unit to determine a decoded sequence of bits.

7. The decoder of claim 2 wherein the initial and next states represent stages of the trellis and wherein the branch metric calculation unit repeats the generation of branch metrics for subsequent stages of the trellis to generate paths through the trellis, and wherein the decoder further comprises:

a trace-back unit to select and trace back a most likely path through the trellis; and a decoder unit to generate a decoded bit sequence based on the selected path.

8. The decoder of claim 1 wherein the two-way ACS operations unit includes:

a plurality of two-way ACS elements to perform two-way ACS operations; and a branch metric routing element to route the branch metrics among the plurality of two-way ACS elements.

9. The decoder of claim 8 wherein the two-way ACS operations unit further includes a path metric routing element to route path metrics among the plurality of the two-way ACS elements.

10. A Viterbi decoder comprising:

a two-way add-compare-select (ACS) operations unit to perform first two-way ACS operations to generate an interim path metric for each of a plurality of interim states, and to perform second two-way ACS operations for each of a plurality of next states to generate a next path metric for each of the next states, wherein the first and second two-way ACS operations comprise a four-way ACS operation;

a branch metric calculation unit to generate branch metrics for branch transitions between initial states and the interim states for a first portion of bits of a group of bits in a received sequence of bits and to generate branch metrics for branch transitions between the interim states and the next states for a second portion of bits of the group of bits; and a synchronization unit to provide the groups of bits of the received sequence of bits to the branch metric calculation unit, wherein the branch metric calculation unit refrains from using bits of the first portion of bits for generating the branch metrics between the initial states and the interim states for code rates of k/n when k is two or greater, and wherein the branch metric calculation unit uses bits of the first portion of bits for generating the branch metrics between the initial states and the interim states for code rates of k/n when k is one.

11. A method of decoding convolutionally encoded data comprising:

performing first two-way ACS operations for each of a plurality of interim states to generate an interim path metric for each of the interim states; and performing second two-way ACS operations for each of a plurality of next states to generate a next path metric for each of the next states, wherein performing the first and second two-way ACS operations comprise performing a four-way ACS operation, wherein the interim path metrics are used for code rates of k/n where k is one, and wherein the interim path metrics are not used for code rates of k/n where k is greater than one.

12. The method of claim 11 further comprising generating branch metrics for a first portion of bits of a group of bits in a received sequence of bits for branch transitions between initial states and the interim states, wherein the interim states represent states of a Viterbi decoder between stages of a trellis.

13. The method of claim 12 further comprising generating branch metrics for a second portion of bits of the group for branch transitions between the interim states and the next states.

14. The method of claim 13 wherein the initial and next states represent stages of the trellis and wherein the method further comprises:

repeating the generating for subsequent stages of the trellis to generate paths through the trellis;

selecting a most likely path; and generating a decoded bit sequence based on the selected path.

15. A method of decoding convolutionally encoded data comprising:

performing first two-way ACS operations for each of a plurality of interim states to generate an interim path metric for each of the interim states;

performing second two-way ACS operations for each of a plurality of next states to generate a next path metric for each of the next states;

generating branch metrics for a first portion of bits of a group of bits in a received sequence of bits for branch transitions between initial states and the interim states;

generating branch metrics for a second portion of bits of the group for branch transitions between the interim states and the next states;

repeating the generating for subsequent stages of a trellis to generate paths through the trellis, the initial and next states representing the stages of the trellis;

selecting a most likely path through the trellis;

generating a decoded bit sequence based on the selected path;

refraining from using bits of the first portion of bits for generating the branch metrics between the initial states and the interim states for code rates of k/n when k is two or greater; and using bits of the first portion of bits for generating the branch metrics between the initial states and the interim states for code rates of k/n when k is one, wherein performing the first and second two-way ACS operations comprise performing a four-way ACS operation.

16. The method of claim 11 wherein:

performing the first two-way ACS operations further comprises routing initial path metrics and initial branch metrics to a plurality of a two-way ACS elements; and performing the second two-way ACS operations further comprises routing the interim path metrics and interim branch metrics among the plurality of the two-way ACS elements.

17. A method of performing a four-way add-compare-select (ACS) operation with two-way ACS operations, the method comprising:
   generating interim branch metrics for a first portion of bits of a group of bits in a received sequence of bits;
   performing first two-way ACS operations using the interim branch metrics to generate interim path metrics for each of a plurality of interim states;
   generating next branch metrics for a second portion of bits of the group; and
   performing second two-way ACS operations using the next branch metrics to generate a next path metric for each of a plurality of next states,
   wherein the interim path metrics are used for code rates of k/n where k is one,
   wherein the interim path metrics are not used for code rates of k/n where k is greater than one, and
   wherein the interim states represent states of the Viterbi decoder between stages of a trellis.

18. The method of claim 17 wherein performing the first two-way ACS operations further comprises routing initial path metrics and initial branch metrics to a plurality of a two-way ACS elements.

19. The method of claim 18 wherein performing the second two-way ACS operations further comprises routing the interim path metrics and interim branch metrics among the plurality of the two-way ACS elements.

20. The method of claim 18 wherein performing the second two-way ACS operations further comprises routing the interim path metrics and interim branch metrics among a second plurality of two-way ACS elements.

21. A computer readable medium having program instructions stored thereon for decoding convolutionally encoded data when executed within a digital processing device, the decoding comprising:
   performing first two-way ACS operations for each of a plurality of interim states to generate an interim path metric for each of the interim states;
   performing second two-way ACS operations for each of a plurality of next states to generate a next path metric for each of the next states;
   generating branch metrics for a first portion of bits of a group of bits in a received sequence of bits for branch transitions between initial states and the interim states; and
   generating branch metrics for a second portion of bits of the group for branch transitions between the interim states and the next states,
   wherein performing the first and second two-way ACS operations comprises performing a four-way ACS operations,
   wherein the interim path metrics are used for code rates of k/n where k is one,
   wherein the interim path metrics are not used for code rates of k/n where k is greater than one, and
   wherein the interim states represent states of the Viterbi decoder between stages of a trellis.

22. The computer readable medium of claim 21 wherein the initial, interim and next states represent stages of the trellis and wherein the decoding further comprises:
   repeating the generating for subsequent stages of the trellis to generate paths through the trellis;
   selecting a most likely path; and
   generating a decoded bit sequence based on the selected path,
   wherein performing the first two-way ACS operations further comprises routing initial path metrics and initial branch metrics to a plurality of a two-way ACS elements, and
   wherein performing the second two-way ACS operations further comprises routing the interim path metrics and interim branch metrics among the plurality of the two-way ACS elements.

23. A computer-readable medium having program instructions stored thereon for decoding convolutionally encoded data, the instructions, when executed within a digital processing device, cause the digital processing device to:
   perform first two-way ACS operations for each of a plurality of interim states to generate an interim path metric for each of the interim states;
   perform second two-way ACS operations for each of a plurality of next states to generate a next path metric for each of the next states;
   generate branch metrics for a first portion of bits of a group of bits in a received sequence of bits for branch transitions between initial states and the interim states;
   generate branch metrics for a second portion of bits of the group for branch transitions between the interim states and the next states;
   repeat the generation of branch metrics for subsequent stages of a trellis to generate paths through the trellis, the initial, interim and next states representing stages of the trellis;
   select a most likely path through the trellis;
   generate a decoded bit sequence based on the selected path;
   refrain from using bits of the first portion of bits to generate the branch metrics between the initial states and the interim states for code rates of k/n when k is two or greater; and
   use bits of the first portion of bits to generate the branch metrics between the initial states and the interim states for code rates of k/n when k is one,
   wherein the first and second two-way ACS operations comprises a four-way ACS operation,
   wherein the first two-way ACS operations cause the digital processing device to route initial path metrics and initial branch metrics to a plurality of a two-way ACS elements, and
   wherein the second two-way ACS operations cause the digital processing device to route the interim path metrics and interim branch metrics among the plurality of the two-way ACS elements.

24. A receiver comprising:
   an input device to receive convolutionally encoded data over a wireless communication channel;
   a converter to convert the convolutionally encoded data to a sequence of bits;
   a Viterbi decoder to decode the sequence of bits by performing a 4-way add-compare-select (ACS) operation with two-way ACS operations; and
   an output device to convert the decoded sequence of bits to an output,
   wherein the Viterbi decoder comprises:
   a branch metric unit to generate interim branch metrics for a first portion of bits of a group of bits in the sequence of bits; and an ACS operations unit to perform first two-way ACS operations using the interim branch metrics to generate interim path metrics for each of a plurality of interim states, wherein the interim path metrics are used for code rates of k/n where k is one, wherein the interim path metrics are not used for code rates of k/n where k is greater than one, and wherein the interim states represent states of the Viterbi decoder between stages of a trellis.

25. The receiver of claim 24 wherein a group is comprised of at least two bits for the code rates of k/n when k is greater than one, and wherein the branch metric unit generates next branch metrics for a second portion of bits of the group, and the ACS operations unit performs second two-way ACS operations using the next branch metrics to generate a next path metric for each of a plurality of next states, wherein the branch metric calculation unit refrains from using bits of the first portion of bits for generating the branch metrics between the initial states and the interim states for the code rates of k/n when k is greater than one, and wherein the branch metric calculation unit uses bits of the first portion of bits for generating the branch metrics between the initial states and the interim states for the code rates of k/n when k is one.

26. The receiver of claim 25 wherein the ACS operations unit further comprises:

a plurality of two-way ACS elements to perform two-way ACS operations; and a branch metric routing element to route the branch metrics among the plurality of two-way ACS elements.

27. The receiver of claim 25 wherein the two-way ACS operations unit further includes a path metric routing element to route path metrics among the plurality of the two-way ACS elements.

* * * * *

UNITED STATES PATENT AND TRADEMARK OFFICE
CERTIFICATE OF CORRECTION

PATENT NO. : 7,020,223 B2
DATED : March 28, 2006
INVENTOR(S) : Vasquez

It is certified that error appears in the above-identified patent and that said Letters Patent is hereby corrected as shown below:

Column 13,
Line 55, delete "operations," and insert -- operation, --.

Signed and Sealed this

Thirteenth Day of June, 2006

JON W. DUDAS
*Director of the United States Patent and Trademark Office*